United States Patent [19]

Kardontchik et al.

[11] Patent Number: 5,566,204
[45] Date of Patent: Oct. 15, 1996

[54] FAST ACQUISITION CLOCK RECOVERY SYSTEM

[75] Inventors: Jaime E. Kardontchik, Sunnyvale; Sam H. Moy, San Bruno; Jack P. Guedj, Los Altos, all of Calif.

[73] Assignee: Raytheon Company, Lexington, Mass.

[21] Appl. No.: 236,939

[22] Filed: May 2, 1994

[51] Int. Cl.$^6$ ...................................................... H04B 1/38
[52] U.S. Cl. ........................... 375/219; 375/294; 375/327; 375/357; 375/360; 375/375; 375/376; 455/84; 455/86; 327/148; 327/157
[58] Field of Search ...................................... 375/219, 259, 375/294, 316, 324, 326, 327, 354, 357, 373, 374, 375, 376; 455/13.2, 75, 76, 84, 86, 87, 255–260, 264, 265, 315, 316; 331/11, 14, 17, 25; 327/2, 5, 39, 41, 141, 155–157, 144–148

[56] References Cited

U.S. PATENT DOCUMENTS

| | | | |
|---|---|---|---|
| 4,633,193 | 12/1986 | Scordo | 375/357 |
| 5,163,160 | 11/1992 | Foucher et al. | 455/87 |
| 5,371,764 | 12/1994 | Gillingham et al. | 375/354 |
| 5,418,496 | 5/1995 | Ford et al. | 375/376 |
| 5,430,772 | 7/1995 | Lee et al. | 375/376 |

*Primary Examiner*—Stephen Chin
*Assistant Examiner*—Amanda T. Le
*Attorney, Agent, or Firm*—W. Clark

[57] ABSTRACT

A transceiver integrated circuit including a transmitter section having a phase-locked loop with an oscillator to provide an output at a predetermined transmission frequency, and a receiver section having a phase-locked loop with an oscillator used to provide a recovered clock from an incoming data signal. In a second mode when no incoming data is being received, the receiver oscillator is controlled in accordance with the transmitter oscillator to operate the receiver oscillator at the expected frequency of future data. Therefore, when data is received, the receiver oscillator is at the same approximate frequency as the incoming data thereby enabling fast acquisition by merely adjusting the phase of the receiver oscillator to the incoming data. In particular, the receiver and transmitter oscillators are identical current controlled oscillators that are operated in the second mode at the same approximate frequency by feeding the receiver oscillator with a current that is substantially equal to the loop current controlling the transmitter oscillator. Further, to provide higher slaving accuracy, a frequency detector is used to compare the outputs of the receiver and transmitter oscillators in the second mode, and to control the receiver oscillator into frequency synchronism with the transmitter oscillator.

22 Claims, 3 Drawing Sheets

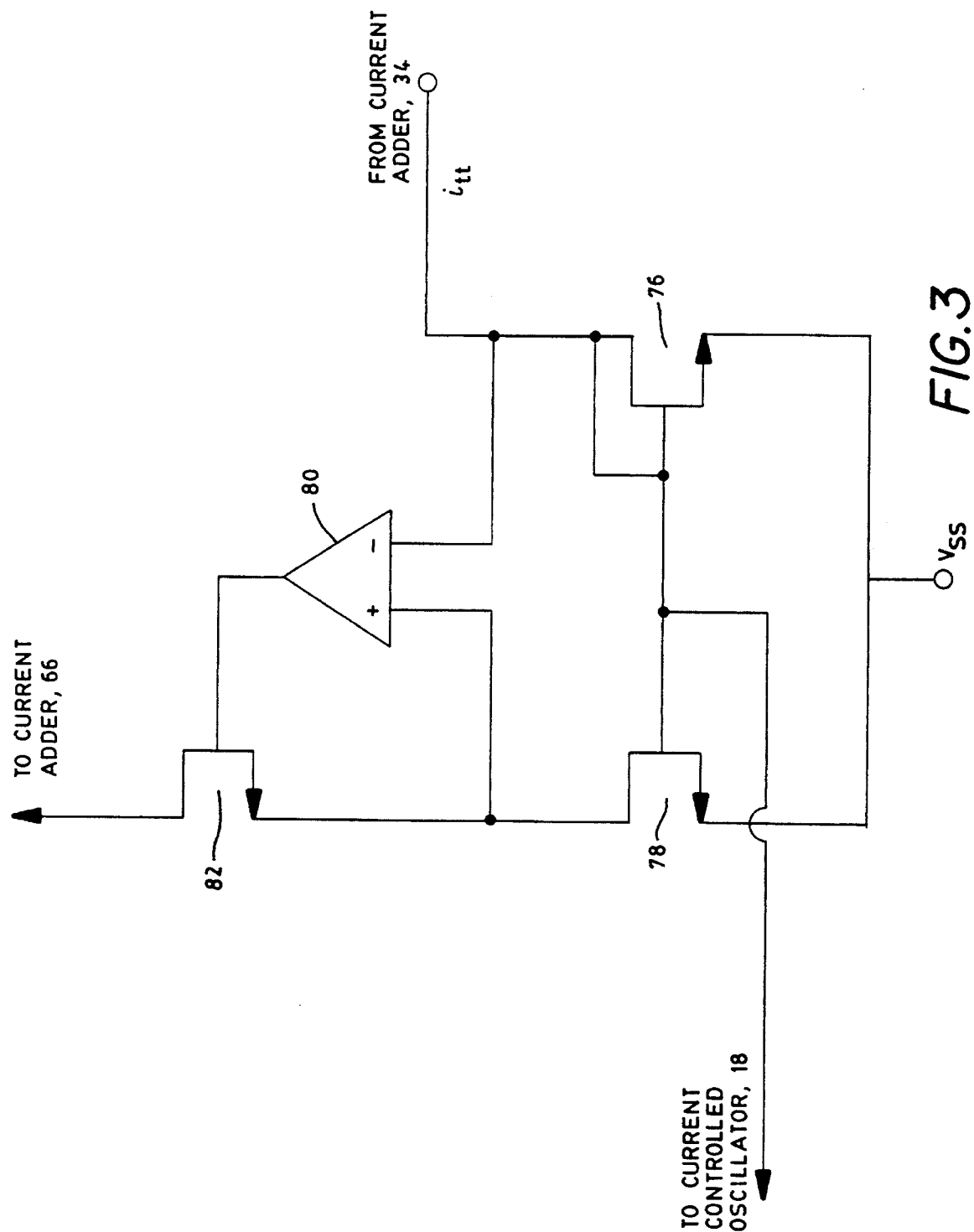

FAST ACQUISITION CLOCK RECOVERY SYSTEM

BACKGROUND OF THE INVENTION

The field of the invention generally relates to clock recovery systems for high speed data communications, and more particularly relates to an integrated CMOS circuit that includes transmitter and receiver sections wherein the receiver section provides fast clock acquisition of an incoming data signal.

As is well known, high speed data is usually transmitted and received in a non-return-to-zero (NRZ) format to minimize distortion by reducing the high frequency content of the signals. For example, consider a string of incoming data 10010 in a NRZ format at a 200 Mbit/sec rate where each bit uses a full period of 5 nanoseconds. Normally, the data clock is not transmitted along with the data because an additional line or channel would generally be required. Therefore, in a typical clock recovery system, the receiver uses the incoming data to generate a clock, usually referred to as the "recovered clock", at exactly 200 MHz, and the recovered clock is aligned with respect to the incoming data. For example, it is desirable that the positive transitions of the recovered clock occur at the exact middles of the data bits where one would expect the maximum voltage if the received bit is a logical "1", or the minimum voltage if the received bit is a logical "0". Once the clock is recovered, the NRZ signals and the recovered clock are fed to respective "data" and "clock" inputs of a flip-flop that functions as a decision device. That is, the flip-flop will be clocked by the recovered clock, and the output will be the recovered data in a clean "1" or "0" state.

Since the desired clock frequency does not appear in the frequency spectrum of the NRZ data, a non-linear operation is normally applied to the incoming data to generate a frequency component containing the clock frequency. In a typical prior art approach, the incoming NRZ data is delayed by 90° in a phase shifter, and the original and delayed NRZ data are fed to an exclusive OR (XOR) gate. As is well known, the output of the XOR will have a frequency component corresponding to the originating or desired clock. The output of the XOR is then fed to a phase detector along with the output of a voltage controlled oscillator (VCO) or current controlled oscillator (CCO). The phase detector and the VCO or CCO are part of a phase-locked loop. That is, the output of the phase detector is used to generate a control voltage or current to the VCO or CCO such that the VCO or CCO is finally brought to oscillate at the same frequency and phase as the originating clock of the incoming NRZ data. However, the VCO or CCO output can not be used to clock the decision device or flip-flop because it is not aligned at the optimum decision point at the middle of the bit period. Thus, it is generally necessary to generate a second clock that is 90° out-of-phase or is in quadrature with the VCO or CCO output. This quadrature clock is then used to clock the decision device, and it catches the NRZ data at the optimum decision points at the exact middles of data bits.

In high frequency data communications, there is generally a requirement for fast acquisition of incoming data. That is, it is desirable that the clock be recovered and aligned with the incoming bits of data after only a short acquisition time using a relatively short preamble at the beginning of the transmission. For example, a typical system may have a requirement that an initial preamble of no more than 1000 bits be used to recover the clock and align it with the incoming data. However, incoming NRZ data is usually very noisy. Therefore, a clock recovery system that uses a phase-locked loop to recover the clock must have a relatively low bandwidth to minimize jitter and operate reliably. As is known in the art, it is difficult to attain a low bandwidth and still provide short acquisition times.

As is well known, a frequency detector is generally slower than a phase detector, and also malfunctions when one of the input waveforms has missing transitions such as would typically be the case with data (i.e. anytime the data was other than alternating 1s and 0s.) Thus, as described earlier herein, a phase detector is used to compare the output of the exclusive OR and the output of the loop oscillator. However, phase detectors generally perform poorly when the two input frequencies are initially far apart from each other, and relatively long acquisition times may result. That is, it may take a relatively long time and a relatively large number of bits before the loop oscillator is brought to the frequency of the originating or desired clock, and the phase is adjusted to align the quadrature clock with the incoming data.

SUMMARY OF THE INVENTION

A CMOS integrated circuit for high speed communications includes a receiver section with a phase-locked loop and a transmission section with a locked loop. More particularly, the locked loop of the transmission section includes an oscillator and a frequency detector wherein the output of the oscillator and a reference signal are fed to the frequency detector, and the output of the frequency detector is used to adjust the oscillator into synchronism with the reference signal, or some multiple thereof. In such manner, the transmitter oscillator is locked to provide an output at a predetermined transmission frequency such as, for example, 200 MHz.

The phase-locked loop of the receiver section includes an oscillator and a phase detector wherein the output of the oscillator and an exclusive OR of an incoming data signal and a delay of that signal are fed to the phase detector, and the output of the phase detector is used to adjust the receiver oscillator into synchronism with the originating clock of the incoming data which is embedded in the exclusive OR signal. In such manner, the receiver oscillator is used to generate a recovered clock for the incoming data signal.

In accordance with the invention, the receiver oscillator is operated in response to the transmitter oscillator in the absence of an incoming data signal. For example, if the transmitter oscillator is operating at a predetermined transmission frequency of 200 MHz, the receiver oscillator is also caused to operate at approximately 200 MHz. Thus, even when the receiver oscillator is not locked to an incoming data signal because no incoming data signal is being received, the receiver oscillator is operated at the expected frequency of a data signal to be received in the future. Therefore, when a data signal is received, the receiver oscillator will be at the same or approximately the same frequency as the data signal, and all that will be required for acquisition is to shift the phase the receiver oscillator to the data signal. In such manner, the acquisition time is made relatively short, and the receiver oscillator rapidly locks onto the incoming data signal to provide a recovered clock that is properly aligned to recover data.

BRIEF DESCRIPTION OF THE DRAWINGS

The foregoing objects and advantages will be more fully understood with reference to the drawings wherein:

FIG. 3 shows a circuit technique for precisely replicating or mirroring a current in CMOS technology.

DESCRIPTION OF THE PREFERRED EMBODIMENTS

Figure 1:
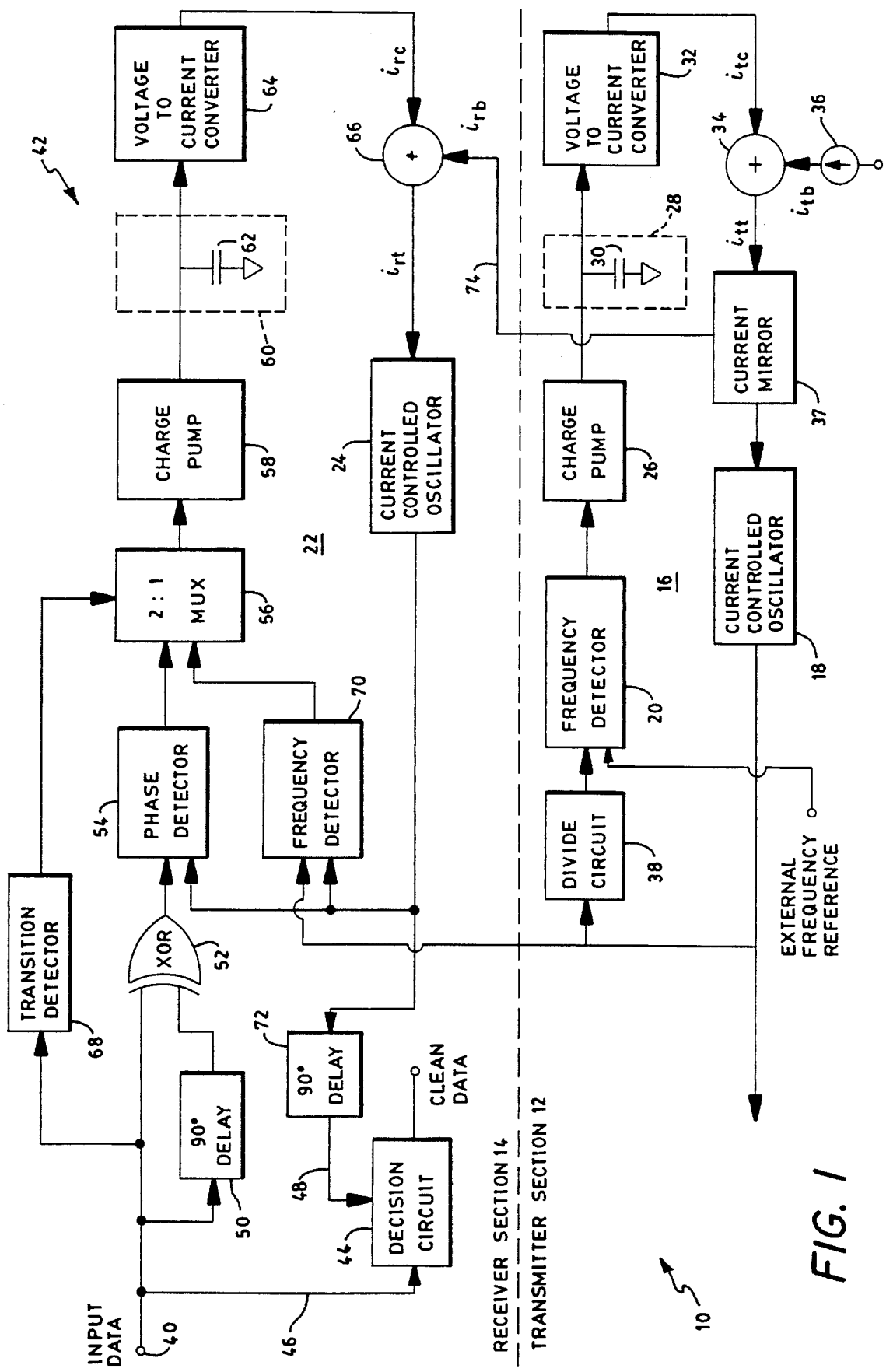
FIG. 1 is a block diagram of clock related portions of receiver and transmitter sections on a transceiver integrated circuit.

FIG. 1 shows clock related portions of a transmitter/receiver or transceiver 10 that is here combined on a CMOS integrated circuit. For example, transmitter section 12 would here typically accept TTL/CMOS compatible parallel bytes from a controller integrated circuit (not shown), encode the data, synthesize a high speed clock, and serialize the data for transmission to a receiver section 14 of a distant transceiver 10. The receiver section 14 here would typically recover a properly aligned clock to perform the reverse operations with error detection functions. FIG. 1 shows only the clock and data recovery portion of the receiver section 14, and the clock or synthesizing portion of the transmitter section 12. Briefly, the transmitter section 12 includes a phase locked loop 16 including a current controlled oscillator 18 that is locked to provide an output at a predetermined transmission frequency such as, for example 200 MHz, by comparing the output to an external frequency reference using frequency detector 20. The receiver section 14 includes a phase-locked loop 22 including a current controlled oscillator 24 that eventually generates a recovered clock by comparing its output to the originating clock embedded in the exclusive OR of an incoming data signal and a 90° delay thereof. In accordance with the invention, the receiver oscillator 24 is operated in accordance with the transmitter oscillator 18 when incoming data is not being received. Therefore, the receiver oscillator 24 is practically frequency locked to the target or expected frequency even in the absence of incoming data. Thus, when data begins to be received, all that is left for the receiver phase-locked loop 22 to do is to acquire phase. Stated differently, the frequency difference between the receiver oscillator 24 and newly initiated incoming data is very small, so the recovered clock can be acquired quickly by mere adjusting receiver oscillator 24 to correct for a phase difference.

Referring more particularly to FIG. 1, the phase-locked loop 16 of transmitter section 12 includes frequency detector 20 having an output fed to a conventional charge pump 26 which may preferably be a differential charge pump. The output of charge pump 26 is coupled to loop filter 28 which includes a capacitor 30 connected to ground. Loop filter 28 is connected to a conventional voltage to current converter 32 that converts the voltage on capacitor 30 to transmitter correction current $i_{tc}$ that is fed to current adder 34. The other input to current adder 34 is a transmitter reference or bias current $i_{tb}$ from current source 36 resulting in a transmitter total feedback current $i_{tt}$ that is fed to current mirror 37 to control current controlled oscillator 18. The output of current controlled oscillator 18 is fed to an optional divide circuit 38 before being coupled to frequency detector 20 to be compared with an external frequency reference. For example, if the external frequency reference is 20 MHz and the divide circuit 38 divides by 10, the transmitter total feedback current $i_{tt}$ will cause the phase-locked loop 16 to lock when the output of current controlled oscillator is driven to 200 MHz. Simply stated, a conventional phase-locked loop 16 is used to lock the output of current controlled oscillator 18 to a predetermined frequency such as 200 MHz which is subsequently used to transmit data to a remote receiver section 14. It is noted that the operation of phase-locked loop 16 is dependent on the external frequency reference which presumably is always present, so the output of the current controlled oscillator 18 will be continuously held at the predetermined transmission frequency.

Figure 2A:
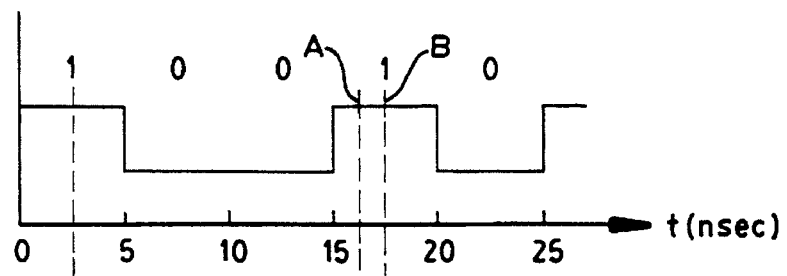
FIGS. 2A–2E shows waveforms at various stages of clock recovery within the receiver section of FIG. 1.

Still referring to FIG. 1, receiver section 14 will first be described with reference to a first mode of operation when incoming data is being received at terminal 40. As an overview to this mode of operation, clock recovery system 42 typically receives an input data signal at terminal 40 in non-return-to-zero (NRZ) format, and generates a recovered clock that is fed to decision circuit 44 to provide clean recovered data. FIG. 2A shows an example of a string of 10010 . . . data in a NRZ format at 200 Mbit/sec rate. For this example, each bit uses a full period of 5 nanoseconds. For simplicity, an ideal waveform has been drawn, but those of skill in the art will understand that the received data signal will typically be distorted and have noise and jitter that normally accompanies data after being transmitted through a channel. That is, the incoming data signal would typically have rounded corners since the channel attenuates high frequency components, and there will be erratic variations of the voltage due to erratic amplitude variations and timing variations at the beginning and ending of each bit. An originating clock used to time the generation of the NRZ data in a transmitter section 12 at a remote site is not transmitted with the NRZ data. Thus, the purpose of the clock recovery system 42 is to take the incoming NRZ data and generate a recovered clock that is at the exact frequency as the NRZ data and aligned so that the positive transitions occur at exactly the middle of the data bits where the maximum level for a "1" and the minimum level for a "0" would be expected to occur. The recovered clock and the NRZ data signal are fed to the decision circuit 44 which is typically a flip-flop (not shown). More specifically, the NRZ data signal is fed on line 46 to the data input and the recovered clock is fed on line 48 to the clock input, and the output of the decision circuit 44 is the recovered data in clean 1's and 0's.

Figure 2B:
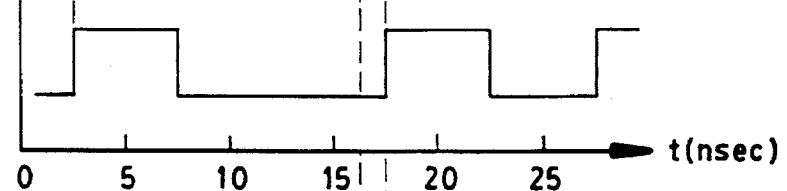
Figure 2C:
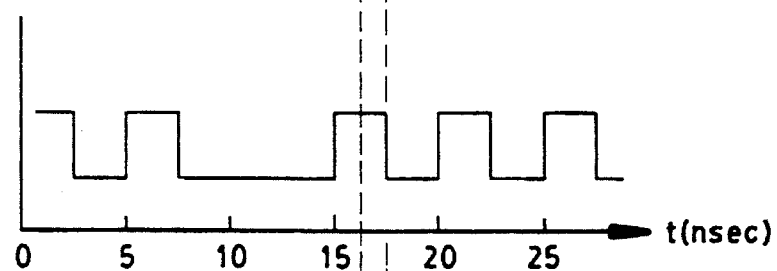

As is well known, the desired or originating clock frequency does not appear in the frequency spectrum of the incoming NRZ data signal. Therefore, a non-linear operation is typically applied to the NRZ data signal to generate a signal containing a frequency component of the originating clock. Here, the incoming NRZ data is fed to 90° delay 50 to provide a signal that is shifted in phase by 90° from the incoming NRZ data. The incoming NRZ data signal as shown in FIG. 2A and the output from 90° delay 50 as shown in FIG. 2B are fed to conventional XOR 52. As is well known, XOR 52 provides a high signal only when one of its inputs is low and the other input is high. Thus, for the example input as shown in FIGS. 2A and 2B, XOR 52 provides the waveform shown in FIG. 2C. As is well known to those skilled in the art, this waveform includes a frequency component of the originating clock for incoming NRZ data.

The output of XOR 52 is coupled to phase detector 54 that is part of phase-locked-loop (PLL) 22. A phase detector is used instead of a frequency detector because phase detectors are generally faster and do not malfunction when one of the input waveforms has missing transitions. That is, a frequency detector could not generally be used unless the input data signal had continuously alternating states. Phase-locked loop 22 further includes multiplexer 56, charge pump 58, loop filter 60 including capacitor 62, voltage to current converter 64, current adder 66, and current controlled oscillator 24. Multiplexer 56 is controlled by transition detector 68 which detects whether an incoming data signal is being received at terminal 40. More specifically, transition detector 68 operates to control multiplexer 56 to couple the output of phase detector 54 to charge pump 58 during this first mode of operation when an incoming data signal is being received, and to couple the output of frequency detector 70 to charge pump 58 during a second mode of operation when incoming data is not being received. Thus, in the first mode of operation now being described, the output of phase detector 54, and thus charge pump 58, is dependent on the phase relationship between the output of XOR 52 and the output of current controlled oscillator 24. More specifically, according to well known phase-locked loop principles, the average output current of charge pump 58 is zero when the output of current controlled oscillator 24 is synchronized in frequency and phase to the embedded NRZ data frequency component in the output of XOR 52. Under such condition, the charge on capacitor 62, the output receiver correction current $i_{rc}$ from voltage to current converter 64, and the receiver total feedback current $i_{rt}$ all remain constant. Thus, the output frequency of current controlled oscillator 24 remains the same.

Figure 2D:
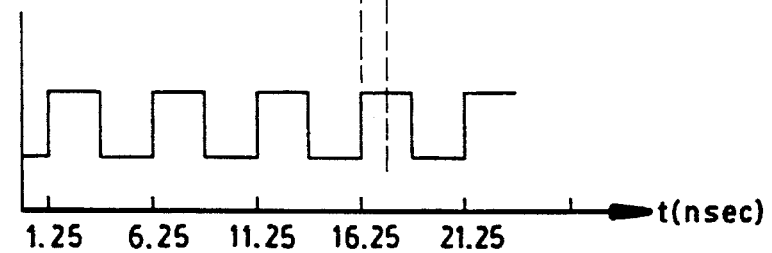
Figure 2E:
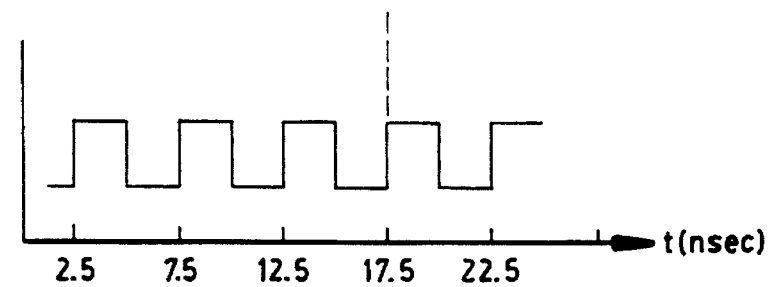

In contrast, when there is a phase difference between the output of current controlled oscillator 24 and the originating clock embedded in the output of XOR 52, an error signal from phase detector 54 causes charge pump 58 to charge or discharge capacitor 62 to provide a change in receiver correction current $i_{rc}$ from voltage to current converter 64 that functions to adjust current controlled oscillator 24 into synchronism with the frequency component of the originating clock for the incoming NRZ data. The receiver correction current $i_{rc}$ from voltage to current converter 64 is added with a receiver bias current $i_{rb}$ that is substantially equal to the transmitter total current $i_{tt}$ used to control the transmitter current controlled oscillator 18. Thus, an error signal from phase detector 54 increases or decreases to increase or decrease the frequency of current controlled oscillator 24 to drive its output into frequency and phase synchronism with the originating clock embedded in the output of XOR 52. For example, if the originating clock of the incoming NRZ data is at a 200 MHz rate, phase-locked loop 22 will lock when the output of current controlled oscillator 24 is at a 200 MHz rate, and the transitions are aligned as shown in FIG. 2D. However, as can be seen by comparing FIG. 2D with the incoming NRZ data in FIG. 2A, the output from current controlled oscillator 24 that is used in the phase-locked loop 22 to feed phase detector 54 is not properly aligned to function as the clock for decision circuit 44. More specifically, the positive transitions of the clock from current controlled oscillator 24 are aligned to catch the NRZ data at point A as shown in FIG. 2A rather than at the optimum position B in the middle of the bit period. Thus, it is desirable to provide a clock that is in quadrature, or has a shift in phase of 90° from the output of current controlled oscillator 24 that is fed to phase detector 54. The phase shift function is provided by 90° delay 72 which delivers to decision circuit 44 the quadrature waveform as shown in FIG. 2E. In response to the positive transitions in the example waveform of FIG. 2E, decision circuit 44 catches the NRZ data at point B in the middle of the bit periods.

In accordance with the invention, a second mode of operation is provided in the absence of incoming data, i.e. when no incoming data is being received at terminal 40. Generally, the purpose of this second mode of operation is to cause current controlled oscillator 24 to operate at the expected frequency for future incoming data thereby eliminating or at least minimizing the frequency shift of current controlled oscillator 24 required to lock phase-locked loop 22 onto incoming data. Thus, all that would be required for acquisition would be to shift the phase of current controlled oscillator 24 to provide the clock shown in FIG. 2D. Thus, after a relatively short acquisition period, the clock would be recovered, and clean data would be clocked from decision circuit 44.

In a manner described heretofore, transmitter current controlled oscillator 18 continuously operates at a predetermined frequency such as, for example, 200 MHz, which is the expected frequency for future incoming data for receiver section 14. Thus, even though future data to be received by receiver section 14 at terminal 40 will be from a different transmitter section 12, receiver current controlled oscillator 24 can be set to the expected frequency by controlling it in accordance with the transmitter current controlled oscillator 18 of its own integrated circuit. Although other methods could be used, the receiver current controlled oscillator 24 is here caused to operate at the predetermined frequency of the transmitter current controlled oscillator 16 using two steps: a coarse step and a fine step.

The coarse step is implemented by using the transmitter total feedback current it in the transmitter phase-locked loop 16 to control the free running operation of the current controlled oscillator 24. More specifically, with reference still to FIG. 1, current mirror 37 causes the receiver bias current added $i_{rb}$ to current adder 66 to be substantially equal to transmitter total feedback current $i_{tt}$ that is used to control current controlled oscillator 18. Thus, assuming the receiver correction current $i_{rc}$ from voltage to current converter 64 to be relatively small, the free running or receiver bias current $i_{rb}$ provided to receiver current controlled oscillator 24 through current adder 66 will approximate the total feedback current $i_{tt}$ used to control transmitter current controlled oscillator 18. Because the two current controlled oscillators 18 and 24 are on the same integrated circuit and are fairly well matched, the free running frequency of the receiver current controlled oscillator 24 will be near to the operating frequency of the transmitter current controlled oscillator 18. For example, if current controlled oscillator 18 is operating at 200 MHz, current controlled oscillator 24 will also operate at approximately 200 MHz.

The fine step uses frequency detector 70 to compare the output of the receiver current controlled oscillator 24 with the output of the transmitter current controlled oscillator 18 that is running at exactly the predetermined frequency such as, for example, 200 MHz. More specifically, the outputs of the two respective oscillators 18 and 24 are fed to frequency detector 70 to provide an output indicative of the frequency difference. As described before, transition detector 68 controls multiplexer 56 to couple the output of phase detector 54 to charge pump 58 when incoming data is being received. However, in the second mode of operation when incoming data is not being received, transition detector 68 controls multiplexer 56 to couple the output of frequency detector 70 to charge pump 58. Thus, in this second mode of operation in the absence of input data, frequency detector 70 essentially takes the place of phase detector 54 in phase-locked loop 22, and a new phase-locked loop is formed synchronizing the output of oscillator 24 with the output of oscillator 18. As required, a small receiver correction current $i_{rc}$ is added in adder 66 to the free running current provided on line 74 to cause receiver current controlled oscillator 24 to operate at the exact same frequency as the transmitter current controlled oscillator 18.

When input data is received at terminal 40 of the receiver section 14, the data is detected by transition detector 68 which switches multiplexer 56 to phase-locked loop 22. Assuming that the incoming data is at the expected frequency such as, for example 200 MHz, the receiver current controlled oscillator 24 is already operating at that frequency, so acquisition can be accomplished with only a phase adjustment to current controlled oscillator 24. This phase adjustment is provided in a relatively short period of time requiring a relatively few number of bits thereby enabling fast acquisition.

Referring to FIG. 3, current mirror 37 functions to provide a receiver bias current $i_{rb}$ equal to the transmitter total feedback current $i_{tt}$. In particular, the transmitter total feedback current $i_{tt}$ from current adder 34 flows through MOS transistor 76 here shown as an n-type having its drain connected to its gate. The gate of transistor 76 is connected to the gate of MOS transistor 78 here shown as an n-type, and $V_{ss}$ serves as a common source voltage for transistors 76 and 78. Since the gate to source voltages of transistors 76 and 78 are the same, their respective drain currents are the same to a first approximation. Operational amplifier 80 also forces the drain voltages of transistors 76 and 78 to be the same, and therefore functions to provide precise replication of the transmitter total feedback current $i_{tt}$. More specifically, the output of operational amplifier 80 is connected to the gate of MOS transistor 82 here shown as an n-type connected in series with transistor 78, and the positive and negative inputs of operational amplifier 80 are connected to the respective drains of transistors 78 and 76. Therefore, the drains of transistors 76 and 78 are forced to the same voltage, and a current equal to the transmitter total feedback current $i_{tt}$ is caused to flow through transistors 82 and 78. The drain of transistor 82 is coupled to current adder 66, so the receiver bias current $i_{rb}$ mirrors the transmitter total feedback current $i_{tt}$. Actually, the circuit shown in FIG. 3 sinks current rather than sourcing current, so current adder 66 would include circuitry to provide a mirror source equal to current $i_{tt}$. As shown, the gate of transistor 76 is also connected to the current controlled oscillator 18. For example, in U.S. Pat. No. 5,399,995 issued Mar. 21, 1995, and CMOS Circuit Providing 90° Phase Delay by the same inventors which is hereby incorporated by reference, current controlled oscillator 18 may include a ring oscillator (not shown) formed by a plurality of inverter delay circuits wherein the gate voltage of transistor 76 is used to mirror the transmitter total feedback current $i_{tt}$ through each inverter to control the delay of each inverter. Thus, ignoring the receiver loop correction current $i_{rc}$, the free running receiver total current $i_{rt}$ is substantially the same as the transmitter total feedback current $i_{tt}$ used to control the transmitter current controlled oscillator 18, so the receiver oscillator 24 operates at substantially the same frequency as the transmitter oscillator 18 when no incoming data is being received. As described earlier, the precision of this objective may be further increased by comparing the outputs of the receiver and transmitter oscillators 24 and 18 in frequency detector 70, and adjusting the frequency of receiver oscillator 24 in accordance therewith. The transmitter oscillator 18 is operating at the expected frequency of incoming data to be received in the future, so very little if any frequency adjustment is necessary for the receiver oscillator 24 when data starts to be received. Thus, a clock for the incoming data is recovered quickly because only an adjustment in the phase of the output of the current controlled oscillator 24 is required.

This concludes the Description of the Preferred Embodiment. A reading of it by those skilled in the art will bring to mind many alterations and modifications that do not depart from the spirit and scope of the invention. Therefore, it is intended that the invention be limited only by the appended claims.

What is claimed is:

1. A communications circuit comprising:

a transmitter locked loop comprising a transmitter oscillator for providing an output at a predetermined frequency;

a receiver phase-locked loop comprising a receiver oscillator and means for controlling said receiver oscillator in response to an incoming data signal to recover the clock of said incoming data signal; and means operable in the absence of an incoming data signal for operating said receiver oscillator at an expected frequency of a future incoming data signal to minimize the receiver oscillator frequency shift required to operate the receiver oscillator at the frequency of said future incoming data signal once received, said operating means comprising means for controlling said receiver oscillator in accordance with said transmitter oscillator.

2. The communications circuit recited in claim 1 wherein said transmitter locked loop, said receiver phase-locked loop, and said operation means are disposed on an integrated circuit.

3. The communications circuit recited in claim 1 wherein said operating means comprises a frequency detector responsive to an output of said transmitter oscillator at said predetermined frequency and an output of said receiver oscillator, said receiver oscillator being responsive to said frequency detector in the absence of an incoming data signal.

4. The communications circuit recited in claim 3 wherein said transmitter and receiver oscillators are current controlled oscillators, and said receiver oscillator is responsive to locked loop current fed back to said transmitter oscillator.

5. A communications system, comprising:

a transmitter comprising a transmitter oscillator responsive to a reference signal for providing an output at a predetermined frequency, said transmitter further comprising a locked loop comprising a frequency detector responsive to said reference signal and said output of said transmitter oscillator, said transmitter oscillator being responsive to an output of said frequency detector;

a receiver comprising a receiver oscillator;

means for controlling said receiver oscillator in accordance with said transmitter oscillator during a first mode of operation when no input data signal is being received by said receiver to cause an output of said receiver oscillator to be substantially at said predetermined frequency during said first mode of operation, said first mode controlling means comprising a second frequency detector responsive to said output of said receiver oscillator and said output of said transmitter oscillator, said receiver oscillator being responsive to an output of said second frequency detector during said first mode of operation; and means for controlling said receiver oscillator in response to an input data signal during a second mode of operation when said input data signal is being received by said receiver to recover the clock of said input data signal.

6. The system recited in claim 5 wherein said transmitter oscillator is responsive to a total feedback current in said transmitter locked loop, and said first mode controlling means further comprises a second locked loop comprising a current adder responsive to a loop correction feedback current and a current equal to said total feedback current of said transmitter locked loop, said receiver oscillator being responsive to a sum current from said current adder.

7. The system recited in claim 5 wherein said second mode controlling means comprises a phase-locked loop comprising said receiver oscillator and a phase detector responsive to said output of said receiver oscillator and an exclusive OR of said input data signal and a delay of said input data signal, said receiver oscillator being responsive to an output of said phase detector during said second mode of operation.

8. The system recited in claim 7 wherein said receiver further comprises means for detecting input data signal transitions and means responsive to said transition detecting means for multiplexing between said output of said second frequency detector and said output of said phase detector, said receiver oscillator being responsive to an output of said multiplexing means.

9. The system recited in claim 5 wherein said receiver and transmitter oscillators are current controlled oscillators.

10. A communication system, comprising:
a transmitter comprising a locked loop comprising a frequency detector and an oscillator responsive to an output of said frequency detector wherein said frequency detector is responsive to an output from said oscillator and a reference clock to drive said output of said oscillator to a predetermined frequency; and
a receiver comprising an oscillator controlled in accordance with said transmitter oscillator during a first mode of operation when no input data signal is being received by said receiver to cause an output of said receiver oscillator to be at substantially the same frequency as said output of said transmitter oscillator during said first mode of operation, said receiver oscillator being controlled in response to an input data signal during a second mode of operation when said input data signal is being received by said receiver to generate a recovered clock for said input data signal, said receiver further comprising a first locked loop operable during said first mode of operation, said first locked loop comprising a second frequency detector, a multiplexer, and said receiver oscillator wherein said second frequency detector is responsive to said outputs of said transmitter and receiver oscillators, said multiplexer is responsive to an output of said second frequency detector, and said receiver oscillator is responsive to an output of said multiplexer.

11. The system recited in claim 10 wherein said transmitter and receiver oscillators are current controlled oscillators.

12. The system recited in claim 10 wherein said receiver comprises a second locked loop operable during said second mode of operation, said second locked loop comprising a phase detector, said multiplexer, and said receiver oscillator, said phase detector being responsive to said output of said receiver oscillator and an exclusive OR of said input data signal and a delay of said input data signal, said multiplexer being responsive to said phase detector, and said receiver oscillator being responsive to said output of said multiplexer.

13. The system recited in claim 12 further comprising an input data signal transition detector, said multiplexer being responsive to an output of said transition detector to switch from one of said modes to the other.

14. The system recited in claim 12 wherein said transmitter locked loop comprises a current adder responsive to said transmitter frequency detector and a bias current to provide a sum current to which said transmitter oscillator is responsive.

15. The system recited in claim 14 wherein said first locked loop of said receiver comprises a current adder responsive to said output of said multiplexer and a bias current equal to said sum current of said transmitter locked loop wherein said receiver oscillator is responsive to said receiver current adder.

16. The system recited in claim 15 wherein said locked loop of said transmitter further comprises a charge pump, a loop filter, and a voltage to current converter wherein said charge pump is responsive to said transmitter frequency detector, said loop filter is responsive to said charge pump, said voltage to current converter is responsive to said loop filter, and said transmitter current adder is responsive to said voltage to current converter.

17. The system recited in claim 15 wherein said first and second locked loops of said receiver further comprise a charge pump, a loop filter, and a voltage to current converter wherein said charge pump is responsive to said multiplexer, said loop filter is responsive to said charge pump, said voltage to current converter is responsive to said loop filter, and said receiver current adder is responsive to said voltage to current converter.

18. On a transmitter and receiver integrated circuit adapted for receiving and transmitting data signals, said integrated circuit comprising:
a transmitter section comprising a phase-locked loop comprising a first frequency detector, a charge pump, a loop filter, a voltage to current converter, a current adder, and a current controlled oscillator connected in a loop, said frequency detector being responsive to an output of said current controlled oscillator and a reference clock to lock said current controlled oscillator output to a predetermined frequency; and
a receiver section comprising a 90° delay adapted to receive an incoming non-return-to-zero data signal and provide an output signal shifted in phase by 90°;
said receiver section further comprising an exclusive OR responsive to said incoming data signal and said phase shifted signal for providing an output signal having a frequency component of an originating clock of said non-return-to-zero incoming data signal;
said receiver section further comprising a transition detector responsive to said incoming data signal for providing a control signal indicating the presence or absence of an incoming data signal;
said receiver section further comprising first and second phase-locked loops each in common comprising a multiplexer, a charge pump, a loop filter a voltage to current converter, a current adder and a current controlled oscillator connected in series, said first phase-locked loop further comprising a second frequency detector connected between said receiver current controlled oscillator and said multiplexer, said second phase-locked loop further comprising a phase detector connected between said receiver current controlled oscillator and said multiplexer;
said multiplexer being responsive to said transition detector to select said second frequency detector as its input to activate said first phase-locked loop during a first mode of operation in the absence of an incoming data signal and to select said receiver phase detector as its input to activate said second phase-locked loop during a second mode of operation in the presence of an incoming data signal;

said second frequency detector further being responsive to said transmitter current controlled oscillator to cause said receiver current controlled oscillator to have an output frequency substantially the same as said transmitter current controlled oscillator during said first mode of operation; and said receiver phase detector further being responsive to said exclusive OR to cause said receiver current controlled oscillator to have an output frequency substantially the same as an originating clock of said incoming data signal during said second mode of operation.

19. The integrated circuit recited in claim 18 wherein said transmitter oscillator is responsive to a total current from said transmitter current adder, and said receiver section current adder is responsive to a current substantially equal to said transmitter total current to give said receiver current controlled oscillator a free-running frequency substantially the same as the frequency of said transmitter current controlled oscillator.

20. In an integrated circuit comprising a receiver section and a transmitter section each of which comprises a phase-locked loop wherein the transmitter phase-locked loop comprises a frequency detector that locks a transmitter current controlled oscillator to provide a predetermined frequency for transmitting data signal, and the receiver phase-locked loop comprises a phase detector that locks a receiver current controlled oscillator to the originating clock frequency of an incoming data signal to generate a recovered clock, a method of operating the receiver current controlled oscillator in the absence of an incoming data signal, comprising a step of:

operating the receiver current controlled oscillator at substantially the same frequency as the transmitter current controlled oscillator in the absence of an incoming data signal to operate the receiver oscillator at the expected frequency of future incoming data to reduce the receiver oscillator frequency shift required to lock to an incoming data signal once received.

21. The method recited in claim 20 wherein said transmitter oscillator is responsive to a current in said transmitter phase locked loop, and said operating step comprises a step of controlling said receiver current controlled oscillator in response to a current substantially equal to said current in said transmitter phase-locked loop.

22. The method recited in claim 20 wherein said operating step further comprises a step of frequency detecting outputs of said transmitter oscillator and receiver oscillator, and controlling said receiver oscillator in response thereto.

* * * * *